(12) United States Patent
Cotte

(10) Patent No.: US 10,127,890 B2
(45) Date of Patent: Nov. 13, 2018

(54) DISPLAY DEVICE WITH BETTER CONTRAST

(71) Applicant: PA.COTTE Family Holding GmbH, Amberg (DE)

(72) Inventor: Pierre-Alain Cotte, Amberg (DE)

(73) Assignee: PA.COTTE FAMILY HOLDING GMBH, Amberg (DE)

( * ) Notice: Subject to any disclaimer, the term of this patent is extended or adjusted under 35 U.S.C. 154(b) by 286 days.

(21) Appl. No.: 15/120,125

(22) PCT Filed: Feb. 18, 2015

(86) PCT No.: PCT/EP2015/000354
§ 371 (c)(1),
(2) Date: Aug. 19, 2016

(87) PCT Pub. No.: WO2015/124291
PCT Pub. Date: Aug. 27, 2015

(65) Prior Publication Data
US 2017/0076693 A1  Mar. 16, 2017

(30) Foreign Application Priority Data

Feb. 19, 2014 (DE) .................. 10 2014 002 272
Jun. 30, 2014 (DE) .................. 10 2014 009 677

(51) Int. Cl.
*G09G 5/10* (2006.01)
*G02B 26/02* (2006.01)
*H01L 51/52* (2006.01)
*H01L 27/32* (2006.01)
*H01L 51/50* (2006.01)
(Continued)

(52) U.S. Cl.
CPC ............... *G09G 5/10* (2013.01); *G02B 26/02* (2013.01); *G02B 27/30* (2013.01); *G09G 3/3208* (2013.01); *G09G 3/36* (2013.01); *H01J 31/12* (2013.01); *H01L 27/3237* (2013.01); *H01L 51/50* (2013.01); *H01L 51/5275* (2013.01); *H01L 51/5281* (2013.01); *G09G 2300/04* (2013.01); *G09G 2320/066* (2013.01); *G09G 2360/144* (2013.01)

(58) Field of Classification Search
CPC ......... G02F 1/133603; G02F 1/133609; G02F 1/133611
See application file for complete search history.

(56) References Cited

U.S. PATENT DOCUMENTS 6,410,942 B1 * 6/2002 Thibeault ............... H01L 33/08
257/88
7,518,149 B2 * 4/2009 Maaskant ....... H01L 31/035281
257/79

(Continued)

FOREIGN PATENT DOCUMENTS

WO  WO 2005059636 A1  6/2005
WO  WO 2013099839 A1  7/2013

*Primary Examiner* — Phu Vu
(74) *Attorney, Agent, or Firm* — Leydig, Voit & Mayer, Ltd.

(57) ABSTRACT

A display device includes a display area including non-illuminated areas and illuminated areas, wherein centroids of adjacent illuminated areas are located at distances from each other which are smaller than a resolving power of a viewer, and wherein the proportion of non-illuminated areas in the entire display area is more than 70%.

32 Claims, 7 Drawing Sheets

(51) Int. Cl.
  *G02B 27/30*   (2006.01)
  *G09G 3/3208*  (2016.01)
  *G09G 3/36*    (2006.01)
  *H01J 31/12*   (2006.01)

(56) References Cited

U.S. PATENT DOCUMENTS

| | | | |
|---|---|---|---|
| 9,515,238 B2* | 12/2016 | Maaskant | H01L 33/20 |
| 9,765,934 B2* | 9/2017 | Rogers | H01L 24/82 |
| 2003/0025849 A1 | 2/2003 | Hara | |
| 2007/0085471 A1 | 4/2007 | Cok | |
| 2007/0222922 A1 | 9/2007 | Jin et al. | |
| 2008/0024470 A1 | 1/2008 | Andre et al. | |
| 2011/0051037 A1* | 3/2011 | Kim | G02B 6/004 349/62 |
| 2011/0303893 A1* | 12/2011 | Wagner | H05B 33/10 257/13 |
| 2012/0169791 A1* | 7/2012 | Whitehead | G02F 1/133603 345/690 |
| 2014/0159067 A1* | 6/2014 | Sakariya | H01L 24/24 257/88 |
| 2014/0267683 A1* | 9/2014 | Bibl | H01L 51/50 348/87 |
| 2014/0354927 A1 | 12/2014 | Kanno et al. | |
| 2015/0179876 A1* | 6/2015 | Hu | H01L 33/06 257/13 |
| 2015/0179904 A1* | 6/2015 | Maaskant | H01L 33/20 257/98 |
| 2017/0167703 A1* | 6/2017 | Cok | F21V 23/003 |

* cited by examiner

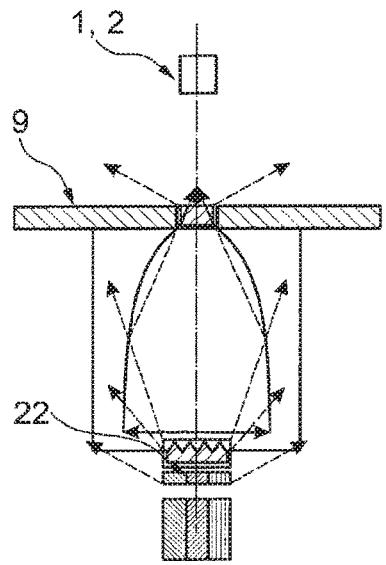
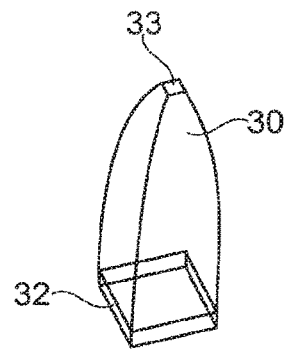
Fig. 5b          Fig. 5c
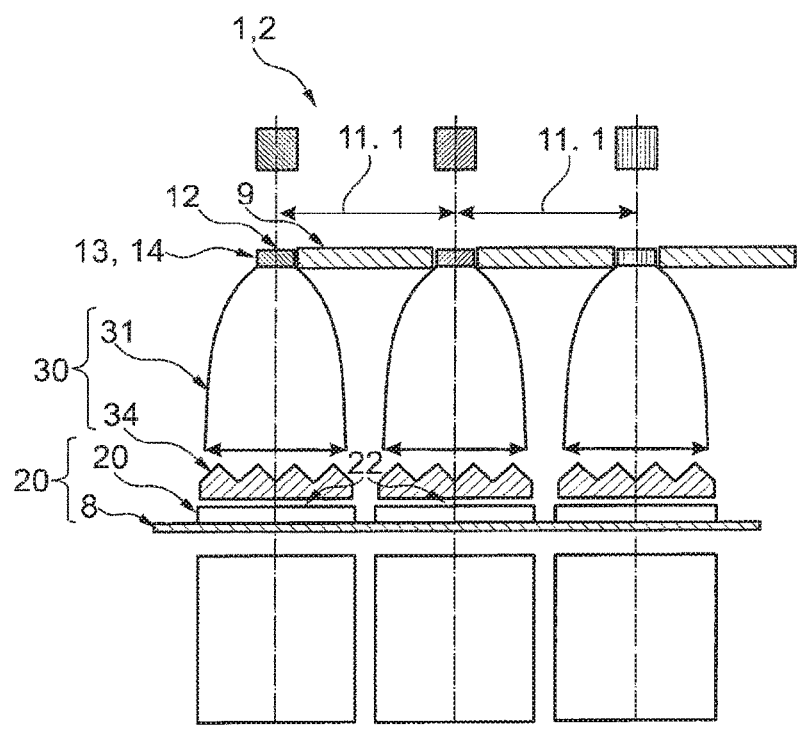
Fig. 5d

DISPLAY DEVICE WITH BETTER CONTRAST

CROSS REFERENCE TO RELATED APPLICATIONS

This application is a U.S. National Stage application under 35 U.S.C. § 371 of International Application No. PCT/EP2015/000354 filed on Feb. 18, 2015, and claims benefit to German Patent Application Nos. DE 10 2014 002 272.2, filed on Feb. 19, 2014, and DE 10 2014 009 677.7, filed on Jun. 30, 2014. The International application was published in German on Aug. 27, 2015 as WO 2015/124291 A1 under PCT Article 21(2).

FIELD

The invention relates to a display device having a display area with a plurality of pixels, e.g. LCD display devices or OLED display devices.

BACKGROUND

US 2008/0024470 discloses an invisible, light-transmissive display system in a light resistant material. Substantially invisible, tapered, light-transmissive holes are penetrated in a light-transmissive pattern through at least a portion of the light resistant material, using a laser beam having a focal width less than the smallest diameter of the tapered holes. The main objective consists in an application as LED indicators, e.g. for batteries or standby light signals which are intended to be integrated invisibly into a material, wherein the holes are intended to be very small per se, the distance between the holes is adapted to the resolving power of the viewer.

SUMMARY

In an embodiment, the present invention provides a display device including a display area including non-illuminated areas and illuminated areas, wherein centroids of adjacent illuminated areas are located at distances from each other which are smaller than a resolving power of a viewer, and wherein the proportion of non-illuminated areas in the entire display area is more than 70%.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 5a through 5d depict sections of a display device according to embodiments of the invention, wherein the display device has light sources and optical beam-shaping devices which are arranged between the illumination device and the display area.

DETAILED DESCRIPTION

Figure 1:
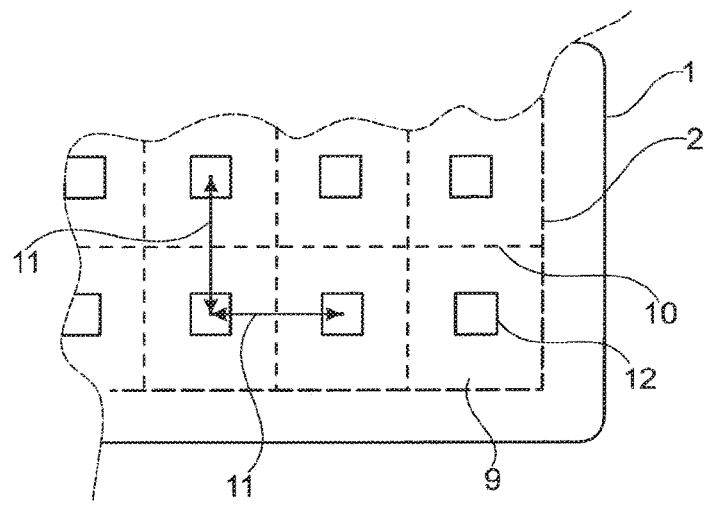
FIG. 1 depicts an enlarged section of a display device according to an embodiment of the invention in which the proportion of non-illuminated areas on the display area is more than 70%.

An embodiment of the present invention provides an improved display device having a display area with a plurality of pixels, e.g. an LCD or an OLED display device, in particular having improved display quality and/or visual impression and/or is designed to be more energy-efficient.

An embodiment of the invention provides a display device having a display area consisting of non-illuminated areas and illuminated areas, wherein the centroids of adjacent illuminated areas are located at distances from each other which are smaller than the resolving power of a viewer and wherein the proportion of non-illuminated areas in the entire display area is more than 70%.

A display device according to an embodiment of the invention is hereby firstly provided which, in a known manner, is at such a high resolution that the human viewer cannot distinguish the individual illuminated areas from one another. Additionally, however, a particular advantage is obtained by a deliberate reduction of the proportion of illuminated areas on the display area, which is precisely the opposite of general attempts to maximize the illuminated area, and an enlargement of the non-illuminated areas between the illuminated areas. Dark areas will then hereby actually also be able to remain dark as they are proportionally much larger than the illuminated areas, even more so e.g. when the proportion of non-illuminated areas is e.g. more than 95% (a preferred feature of this invention, see below), and are less light-reflective, which is particularly advantageous in darker areas of the image and/or in strong ambient light. This in turn provides a good electricity-saving potential, as less light is needed to achieve a good contrast value (with available ambient light). Furthermore, an additional increase in contrast is achieved because there is a greater separation between the individual illuminated areas due to non-illuminated areas, and thus on the one hand there is no, or only a substantially reduced, light "crosstalk" between adjacent illuminated areas.

By a display device or a display is meant a device which is set up to display preferably digital or digitized images, text, graphics or video, which are each composed of individual pixels. For example, it is a display of a hand-held device (e.g. mobile radio unit/smartphone, wristwatch/pocket watch, pocket media player, tablet etc.), of a conventional computer (laptop, desktop etc.), of a television or of an advertising/information display panel (e.g. in underground railways, sports stadia or department stores, on walls of houses etc.).

The display area is preferably an area of the display device facing the viewer, within which the individual pixels are arranged. The display area is preferably limited by an (imaginary) line which runs along the outermost pixel, preferably along the outermost illuminated areas of the display device. Preferably, as a rule, a frame which e.g. ensures mechanical stability, but which is all the more advantageous for e.g. the design the thinner it is, runs around the display area.

An illuminated area is, e.g., an area from which light beams emanate towards the viewer when in switched-on mode. The light beams can be either generated or emitted directly in the area (e.g. by an active light source, such as an LED, arranged in the illuminated area) or they can be guided to the viewer through the illuminated area (background lighting as with LCD screens). The area preferably extends partially or completely through air or an immaterial area. It is preferably surrounded by a frame or a mask. Particularly preferably, the area consists, partially or completely, of a solid that is at least partially, or to a certain degree, or completely transparent, or the area runs through same, partially or completely. For example, the illuminated areas are those areas of the display device which represent the subpixels and emit the light to the viewer when the subpixels are illuminated. The illuminated area can have any shape, but is preferably square or round. Preferably, at least one illuminated area shape is identically present with uniform repetition. One illuminated area is preferably assigned to one pixel.

A non-illuminated area is, e.g., an area which is present between the illuminated areas and which does not itself illuminate and is not backlit. Preferably one or all non-illuminated areas is/are at least 90% light resistant. The centroid of an illuminated area is, e.g., the geometric focus or focus of the area which corresponds, mathematically, to the averaging of all points within the area. Distances which are smaller than the resolving power of a viewer are preferably such that the pixels or illuminated areas are arranged so close together that a viewer whose eyes are preferably at a distance from the display device which is customary for the specific type of display device in the use of the display device can no longer distinguish between two adjacent pixels or illuminated areas.

Preferably, the distances which are smaller than the resolving power of the viewer are those distances which appear, to the viewer, to be at an angle of at most two angular minutes. The pixels or illuminated areas are hereby no longer distinguishable to a majority of viewers, as human resolving power, under the most unfavourable conditions, corresponds to approximately 2 angular minutes. Particularly preferably, distances to the viewer appear to be at most at an angle of 1 angular minute, particularly preferably 0.5 angular minutes, particularly preferably 0.25 angular minutes. The pixels or illuminated areas are hereby no longer distinguishable to almost all human viewers. The smaller the maximum angle, the fewer viewers there are with sufficiently good visual capacity to distinguish between two pixels or illuminated areas.

Preferably, the eye(s) of the viewer is (are) at a distance from the display area which is customary for the specific type of display device in the use of the display device. For example, the distance is 5 cm to 1.20 m, preferably 15 cm to 60 cm for displays of hand-held devices (mobile telephone, watch, tablet computer), 25 cm to 2 m, preferably 40 cm to 1 m for displays of desktop computers, 1 m to 7 m, preferably 2 m to 5 m for televisions, and/or 2 m to 100 m, preferably 5 m to more than 100 m for advertising/information display panels. Particularly preferably, the distances which are smaller than the resolving power of the viewer are less than 1 mm, wherein this is e.g. a distance in the case of a television at which the user can then no longer distinguish between the individual pixels or illuminated areas at a customary viewing distance (>2 m).

For example, the display device is a desktop computer with a minimum user distance (relative to the eye) of 50 cm. On the hypothetical assumption that e.g. 70% of potential users do not have resolving power better than 0.6 angular minutes, the pixels or illuminated areas of the display device are at a distance from one another of less than or equal to 87 µm, preferably 80 µm, for a safety margin, thus making a particularly high-quality representation possible for at least 70% of users during customary use of the display device, because they cannot distinguish between individual illuminated areas. The result is a resolution of the display device of 317 DPI, preferably 320 DPI with a safety margin.

Preferably, the distances which are smaller than the resolving power of the viewer are at most 190 µm, preferably at most 80 µm, particularly preferably at most 50 µm. It is hereby achieved that even if the viewer moves closer to the display area than is customary, he cannot distinguish between individual pixels or illuminated areas. Depending on the resolving power and accommodation ability of the individual viewer, it thus does not even matter how close the individual viewer comes to the display device because he cannot distinguish between the individual pixels or illuminated areas even with optimum use of his eyesight and approaching the closest focussing distance of his eyes.

Preferably, the extent of one, preferably every, illuminated area is at most 70 µm, preferably at most 25 µm, particularly preferably at most 10 µm or even at most 5 µm. It is hereby achieved that with the naked eye the viewer cannot recognize illuminated areas (when switched off) and the contrast has a greater effect. The extent is preferably an extent, preferably the maximum extent, of an illuminated area parallel to the display area. Particularly preferably the extent is smaller than or equal to the wavelength of the light which is visible and/or which is to be passed through. It is e.g. at most 2 µm, preferably at most 1 µm or at most 0.5 µm. The exit angle of the light emanating from the illuminated area is hereby greater, in particular because of the Rayleigh criterion.

The proportion of non-illuminated areas in the entire display area is preferably the proportion of the sum of all portions of the area of non-illuminated areas on the surface area of the entire display area. It is preferably inverse to the proportion of illuminated areas at the display area, i.e. the proportion of non-illuminated areas and the proportion of illuminated areas in the entire display area is preferably 100%.

The proportion of illuminated areas in the display area is preferably the proportion of the sum of all portions of the area of illuminated areas in the entire display area. Thus far, the non-illuminated areas of the display area have customarily resulted because of wirings of the control of LCD cells and, in the state of the art, the aim has been to minimize these other areas as much as possible so that the illuminated areas receive as much space as possible.

The proportion of non-illuminated areas in the entire display area is preferably greater than 80%, preferably greater than 90%, particularly preferably greater than 95%, quite particularly preferably greater than 98% and finally even more preferably at least 99%. Preferably, in analogy to this, the proportion of illuminated areas in the entire display area is at most 20%, preferably at most 10%, particularly preferably at most 5%, quite particularly preferably at most 2% and finally even more preferably at most 1%. The higher the proportion of non-illuminated areas and/or the lower the proportion of illuminated areas, the stronger the effects according to embodiments of the invention as mentioned at the outset.

In a further display device according to an embodiment of the invention one or more illuminated areas are assigned to a pixel and the display area has a plurality of such pixels, which are arranged in a preferably uniform, repeating pattern, with the result that images can be composed from the pixels.

Preferably, illuminated areas of one pixel have shorter distances from one another than the distances to illuminated areas of another pixel. Preferably, one illuminated area, particularly preferably all illuminated areas are separated from other illuminated areas of other pixels, e.g. by an area which is not light-emitting or light-conducting, i.e. through non-illuminated areas. For example, the display device is monochromatic and each of the pixels is formed by a single illuminated area, or the display device is polychromatic and each of the pixels is formed by two or more illuminated areas, wherein the illuminated areas light up in different primary colours or the pixels are formed by an illuminated area each which lights up poly chromatically.

In a further display device according to an embodiment of the invention, a majority, preferably all, of the non-illuminated areas have a reflectance of diffuse reflection of less than 50%. The non-illuminated areas are hereby advantageously used to positively influence the contrast ratio. The less diffuse reflection occurs, the darker the non-illuminated areas appear. A decisive advantage is in turn that, unlike customary display devices, a much larger area is available (specifically the entire area of all non-illuminated areas) to produce a low reflectance, wherein it need not be taken into consideration that the non-illuminated areas have to be transparent or can transmit light, and a low reflectance can thus be achieved more simply and with greater flexibility (e.g. by means of the choice of material, surface structure, surface coating etc.). Preferably, the reflectance of diffuse reflection is less than 25%, particularly preferably less than 10%, quite particularly preferably less than 5% and even more preferably less than 1%.

By contrast, in the state of the art, the background of the illuminated areas (OLED, LCD, LED, etc.) is provided with a very high reflectance in order to bring forth as much light as possible (by means of an illuminated area that is as large as possible). This has a negative effect on the contrast in darker areas, in particular in strong ambient light, which in turn forces the light intensity to increase in order to achieve a good contrast with respect to the ambient light, which in turn requires more energy. This is in turn a substantial disadvantage for e.g. portable devices. With this invention, precisely the opposite is intended and achieved (even if the background of the minimum illuminated areas is provided with a very high reflectance).

A reflectance of diffuse reflection can be measured preferably as a so-called light reflectance value, LRV (preferably according to the British measurement standard BS8493: 2008+A1:2010), particularly preferably as an albedo value by means of an albedometer, wherein preferably a majority, preferably all of the non-illuminated areas have an albedo of less than 0.5, preferably less than 0.25, particularly preferably less than 0.10, quite particularly preferably less than 0.05 and even more preferably less than 0.01. Albedo is preferably the ratio of the radiation flux reaching the viewer from a full irradiated surface to that which would reach the viewer from an absolutely white disk (a so-called Lambertian radiator) of the same size reflecting diffusely, in the case of normal incidence of light.

In a further display device according to an embodiment of the invention, a majority, preferably all, of the non-illuminated areas have a reflectance of specular reflection of less than 50%. The non-illuminated areas are hereby advantageously used to positively influence the contrast ratio. The less specular reflection occurs, the darker the non-illuminated areas appear, as brighter objects are less reflected thereupon. Additionally, legibility is increased as a blending in of non-uniform mirror images over the display image is reduced. A decisive advantage is in turn that, unlike customary display devices, a much larger area is available for producing a low reflectance. Preferably, the reflectance of specular reflection is less than 25%, particularly preferably less than 10%, quite particularly preferably less than 5% and even more preferably less than 1%. In the state of the art (conventional screens), the (larger) illuminated areas are mostly provided with glass or a glass-like material, and thus the entire display area has a larger specular reflectance. By contrast, this invention is based on very small illuminated areas, with the result that the display area therefore has scarcely any specular reflections, even if the illuminated areas are provided with glass or a glass-like material.

A reflectance of specular reflection can be measured preferably in GU (gloss unit) by means of a gloss meter, wherein preferably a majority, preferably all, of the non-illuminated areas have a gloss in GU of less than 50 GU, preferably less than 25 GU, particularly preferably less than 10 GU, quite particularly preferably less than 5 GU and even more preferably less than 1 GU. Preferably, the scale for GU is based on the reference value which is achieved in the case of a polished, black glass. During calibration, this reference value is preferably fixed at 100 GU. The second reference point of the scale is preferably 0 GU, the measurement value at which a perfectly matte surface is achieved.

In a further display device according to an embodiment of the invention, the entire display area has a reflectance of diffuse reflection of less than 50% and/or a reflectance of specular reflection of less than 50%. Because the proportion of non-illuminated areas on the whole surface area is dominant, a reflectance (specular and/or diffuse) of the entire display area can also be effectively reduced in a simple manner, and thus a very good contrast ratio obtained. Preferably, the reflectance of specular reflection of the entire display area is less than 25%, particularly preferably less than 10%, quite particularly preferably less than 5% and even more preferably less than 1%. Preferably, the reflectance of diffuse reflection of the entire display area is less than 25%, particularly preferably less than 10%, quite particularly preferably less than 5% and even more preferably less than 1%.

In a further display device according to an embodiment of the invention, a majority, preferably all, of the non-illuminated areas, have a dark colour or are black. A lower reflectance in particular of the diffuse reflection is hereby achieved. A dark colour is preferably a colour in an RGB colour space (e.g. sRGB or Adobe RGB 1998), the mean value of the R, G and B values of which is less than or equal to 25% of the maximum value, i.e. e.g. at a maximum value of 255 (for each of the R, G, B 256 steps), the mean value is lower than 63.75.

Particularly preferably, a dark colour is one of the Pantone colours: 1545, 1545 C, 161, 161 C, 168, 1815, 1817, 2617 C, 262, 2627, 2627 C, 2685 C, 2695 C, 273 C, 2735 C, 2738, 2738 C, 274, 274 C, 2745, 2745 C, 2747, 2747 C, 2748, 2748 C, 275, 275 C, 2755, 2755 C, 2756 C, 2757, 2757 C, 2758, 2758 C, 276, 276 C, 2765, 2765 C, 2766, 2766 C, 2767, 2767 C, 2768, 2768 C, 280, 280 C, 281, 281 C, 282, 282 C, 287 C, 288, 288 C, 289, 289 C, 294 C, 295, 295 C, 2955, 2955 C, 296, 296 C, 2965, 2965 C, 302, 302 C, 3025, 303, 303 C, 3035, 3035 C, 309, 309 C, 316, 316 C, 3165, 3165 C, 3292, 3292 C, 3298 C, 330, 330 C, 3302, 3302 C, 3305, 3305 C, 3308, 3308 C, 336, 336 C, 342, 342 C, 3425, 3425 C, 343, 343 C, 3435, 3435 C, 349, 349 C, 350, 350 C, 356, 356 C, 357, 357 C, 368 2X, 412, 412 C, 419, 419 C, 426, 426 C, 432 C, 433, 433 2X, 433 C, 439, 439 C, 440, 440 C, 447, 447 C, 448 C, 4485, 4625, 4625 C, 469, 4695, 4695 C, 476 C, 483, 483 C, 490, 490 C, 497, 497 C, 4975, 4975 C, 504, 504 C, 505, 5115, 5115 C, 5185, 5185 C, 5255, 5255 C, 532, 532 C, 533 C, 534 C, 539, 539 C, 5395, 5395 C, 540, 540 C, 541, 541 C, 546, 546 C, 5463, 5463 C, 5467, 5467 C, 547, 547 C, 548, 548 C, 553, 553 C, 5535, 5535 C, 554, 554 C, 560, 560 C, 5605, 5605 C, 561 C, 567 C, 5743 C, 5747 C, 5753, 5757, 5815, 626, 627, 627 C, 648, 648 C, 654, 654 C, 655, 655 C, 662, 662 C, 669 C, 725, 731, 732, 732 C, 7421 C, 7449 C, 7463 C, 7476 C, 7483 C, 7484 C, 7533 C, 7546 C, 7547 C, 7554 C, 7631 C, 7645 C, 7693 C, 7694 C, 7720 C, 7721 C, 7722 C, 7727 C, 7728 C, 7729 C, 7732 C, 7733 C, Black, Black 2, Black 2 2X, Black 2 C, Black 3, Black 3 2X, Black 3 C, Black 4, Black 4 2X, Black 4 C, Black 5, Black 5 2X, Black 5 C, Black 6, Black 6 2X, Black 6 C, Black 7, Black 7 2X, Black 7 C, Black C, Blue 072 C, Dark Blue C, Neutral Black C, Reflex Blue, Reflex Blue 2X, Reflex Blue C.

In a further display device according to an embodiment of the invention, a majority, preferably all, of the non-illuminated areas have a mean roughness index in the range from 0.2 µm to 1.0 µm. Because of this, in particular specular reflections in the range of the wavelengths of visible light are reduced. Preferably, the mean roughness index is in the range from 0.4 µm-0.8 µm. Preferably, to establish this measurement value, the surface is scanned over a specific measured section and all height and depth differences of the rough surface are recorded. After calculating the definite integral of the course of this roughness over the measured section, this result is finally divided by the length of the measured section.

In a further display device according to an embodiment of the invention, a majority, preferably all, of the non-illuminated areas are coated by means of an anti-reflection coating. In particular specular reflections are also hereby reduced. An anti-reflection coating is preferably an anti-reflective film (e.g. 3M™ Vikuiti™) or an antireflective coating. The anti-reflection coating preferably has a rough surface (e.g. with a mean roughness index in the range from 0.2 µm to 1.0 µm) and/or antireflective coatings based on destructive interference.

In a further display device according to an embodiment of the invention, the display device has an electronic compensation device, by means of which a minimum brightness of the illuminated areas can be set automatically for adapting the representation of black image pixels in dependence on the ambient brightness. The contrast ratio can hereby be adapted to the ambient brightness. Even if the non-illuminated areas are designed to be as dark and non-reflective as possible, the brightness of the non-illuminated areas will be lighter or darker, depending on the ambient brightness. By means of the compensation device, the minimum brightness of the illuminated areas can, however, also be correspondingly adapted to the brightness of the non-illuminated areas. A black image pixel is one which e.g. contains (0, 0, 0) as RGB image information. By means of the compensation device, this black point is adapted to the ambient brightness, i.e. e.g. it is increased in the case of greater ambient brightness and reduced in the case of lower ambient brightness. For example, in the case of high solar radiation, a black pixel is not represented by completely switched-off illuminated areas; instead, the illuminated areas are activated with a brightness, with the result that the illuminated areas have approximately the same brightness as the non-illuminated areas. The other brightness levels of the image to be displayed are then distributed over the remaining area between the minimum brightness set by the compensation device and the maximum brightness of the illuminated areas. In this way, the dark picture proportion is not "reduced". Preferably, the electronic compensation device has an ambient light sensor.

In the description below, inter alia, light sources are also named. These, and their relation to the illuminated areas, are first described in general terms. A light source is preferably a controllable light source, wherein the light emitted by the light source can be at least switched on and off, but preferably the intensity of the emitted light can be modulated in a plurality of steps or continuously. It is e.g. an active light source such as an LED (OLED, micro LED), a laser (e.g. a VCSEL or surface emitter), preferably with a beam diameter of 5 µm or less, or a plasma cell. Very small and energy-efficient light sources are thus possible. A light source can also be a UV LED or blue LED which interacts with a layer of luminescent material, or an electron emitter which interacts with a luminescent material. The maximum extent of a light-active area (i.e. active illuminated area) of the light source (e.g. the area of the PN junction) or of a laser beam generated by the light source parallel to the display area is preferably smaller than or equal to the maximum extent of the illuminated area, i.e. e.g. at most 70 µm, preferably at most 25 µm, particularly preferably at most 10 µm or 5 µm or even smaller e.g. 2 µm, 1 µm or 0.5 µm. Preferably, the illuminated area has a scatter element, in particular if the maximum extent of the beam, in particular laser beam, generated by the light source is smaller than the maximum extent of the illuminated area. Preferably, the light sources are elements of a light source array or pixels or subpixels of a display, in particular an OLED display, incorporated in the display device as an illumination device and arranged behind the illumination areas. For example, a pixel and/or subpixel array of a display, e.g. 1×2, 2×2, 4×4, 5×5, 10×10 or 100×100 pixels or subpixels is assigned to an illuminated area.

Preferably, at least one of the light sources, preferably every light source, is a dichromatic, preferably polychromatic light source or there are different light sources with different emission wavelengths. A two-colour, multicolour or full-colour representation by means of the display device is hereby possible. Monochromatic means preferably that the light source emits substantially in a specific, preferably constant, wavelength range or wavelength mix (e.g. red), dichromatic means preferably that the light source is set up to emit light controllably in two different wavelength ranges (e.g. a respectively controllable green and red proportion), polychromatic means preferably that the light source is set up to emit light controllably in two or more different wavelength ranges (e.g. a respectively controllable green and red and blue proportion).

Preferably, precisely one monochromatic light source, preferably polychromatic light source, is assigned to each illuminated area. The light sources are hereby assigned to the illuminated areas, whereby an individual modulation of the light sources is possible and thus this embodiment is different, e.g. from an LCD which has poorer energy consumption, in which light is generated over a large area but then needs to be darkened again locally. Instead of this spatially subtractive image formation, a spatially additive image formation is preferably made possible. Different monochromatic light sources are e.g. those which each radiate in one wavelength range per se, but the wavelength ranges of the individual light sources differ from each other (e.g. red, green, blue). Identical monochromatic light sources are e.g. those which all radiate in substantially the same wavelength range in each case. Alternatively, a plurality of illuminated areas are assigned to one or more monochromatic light sources, preferably polychromatic light sources. Preferably, a pixel is formed by a plurality of illuminated areas, to which light sources of different wavelengths are assigned. For example, a pixel is formed by three or more illuminated areas, wherein at least one illuminated area is assigned one or more light sources which emit green light to the illuminated area, at least one second illuminated area is assigned one or more light sources which emit blue light to the second illuminated area, and at least one third illuminated area is assigned one or more light sources which emit red light to the third illuminated area. Preferably a light path exists to each of the illuminated areas, for a plurality of monochromatic light sources. Alternatively, a light path exists to each of the illuminated areas, for one or more polychromatic light sources. Preferably, a non-imaging optical element, e.g. a scatter element, is present for an advantageous homogenization of the polychromatic light sources.

In a further display device according to an embodiment of the invention, the display device has an illumination device with a substrate on which a plurality of light sources are arranged. A display device having a display area according to an embodiment of the invention can hereby be produced in a simple manner.

From the viewer's point of view, the illumination device is preferably arranged behind the illuminated areas, and set up to illuminate the illuminated areas from behind, i.e. from the rear thereof. The rear is the side of an illuminated area facing away from the viewer.

The illumination device preferably has one or more active light sources or passive light sources, such as e.g. deflecting mirrors, which can guide light from another light source, which for example can also represent ambient light, in particular daylight or sunlight, onto the illuminated areas, from behind.

The distance between the illuminated areas and the illumination device (e.g. measured from a light-emitting or light-reflecting surface of the illumination device, which emits or transmits light already substantially parallel to the viewing direction) is preferably at most 3 mm, particularly preferably at most 1 mm, quite particularly preferably at most 0.5 mm or even more preferably at most 0.2 mm.

The substrate is preferably a flat plate, e.g. a circuit board or a wafer.

One possible realization of light sources provides, for example, lasers with e.g. 5 µm beam diameter, which are arranged on a substrate (such as for example a Si wafer) as an array, e.g. in the form of a square with an edge length of e.g. 50 µm. Preferably, a scatter element is arranged over such a square, which also simultaneously forms the illuminated area. The individual lasers in a square preferably have different emission wavelengths from each other. Many such units then form pixels or subpixels of the display device.

In a further display device according to an embodiment of the invention, each of the illuminated areas is formed by one of the light sources or by an optical scatter element or transparent cover element or optical colour-filter element which can be illuminated by one of the light sources and the non-illuminated areas of the display area are formed by areas of the substrate and/or by areas of a filling material between the illuminated areas.

A particularly efficient image representation is made possible by this preferred design of the illuminated areas and assignment to the light sources. In particular the reflective properties of the non-illuminated areas can be set very well due to the design of the non-illuminated areas of substrate material or filling material. The filling material is preferably a pourable material or is built up by means of a 3D printing process between the light sources or a material which can be adapted to the shape (around the illuminated areas) or a material which allows the illuminated areas to shine through (transparent and/or close-meshed and/or perforated).

An optical scatter element is preferably a body which guides light which strikes the scatter element from one direction in more than two different directions, preferably in a plurality of different directions, whether transmissively and/or reflectively. For example, the optical scatter element is a semi-transparent and/or matte body (translucent glass body) made of glass or plastic, preferably with embedded scatter particles (e.g. silver particles or nanoparticles), a microprism, a matte film for adhesion, a tiny ground glass or a diffractive optical system, e.g. a grid. The scatter element is preferably set up to serve (approximately) as a Lambertian radiator, e.g. with the result that a uniform radiation within a large solid angle, e.g. 180°, is produced. Preferably, it is set up to scatter according to the Rayleigh effect and/or according to the Plasmonic effect. For example, this means that the scatter element has openings which are smaller than the wavelength of the visible light and/or the light to be passed through (e.g. 1 µm or less). It is preferred, e.g. in this case that the illuminated area is framed by a non-transparent mask (e.g. a cover layer described below) or a frame, and the extent of the illuminated area is e.g. less than the wavelength of the visible light and/or the light to be passed through, with the result that a scatter element is produced merely by the size of the illuminated area in combination with a framing.

In a further display device according to an embodiment of the invention, each light source has an electron emitter which is set up to cause a layer of luminescent material to actively light up by emitting an electron beam, or each light source has a UV emitter which is set up to cause a layer of luminescent material to actively light up by emitting a UV light beam.

In this way, light sources which are very efficient and spectrally well adjustable are produced. In particular, due to the area ratios of non-illuminated areas and illuminated areas according to an embodiment of the invention, the UV emitters and in particular the electron emitters can be better separated from each other, which is particularly advantageous in the case of electron emitters, which each require their own vacuum cell. By a UV emitter is also preferably meant an emitter which emits in the blue to violet range (with or without the UV range). A vacuum is necessary in the case of electron emitters and the distance between the illuminated areas of this invention can thus be used to incorporate spacers, which is very difficult in the state of the art, because the illuminated areas are very large or as large as possible and spacers cause interference (e.g. shadowing).

In a further display device according to an embodiment of the invention, the display device has an illumination device with a light source or with a plurality of light sources and the active illuminated area of the light source or, if the illumination device has a plurality of light sources, each of the active illuminated areas of the light sources has a surface area which is greater than the surface areas of the illuminated areas of the display area.

The light can hereby be produced on a greater area than the size of the illuminated areas and thus a higher radiation density can be achieved within the illuminated areas, preferably with additional concentration of the light on the smaller illuminated areas. Preferably, the surface of the illumination device or the sum of the surfaces of the illumination device which emit light is greater than the sum of all the surface areas of the illuminated areas. Preferably, the total extent of all the light sources assigned to an illuminated area is greater than the extent of the illuminated area. Preferably, the light sources are polychromatic and the light sources or the active illuminated areas thereof have an extent which is greater than 50%, preferably greater than 75% of the distance between the centroids of the illuminated areas. Preferably, the light sources are monochromatic and the light sources or the active illuminated areas thereof have an extent which is greater than 50%, preferably greater than 75% of one third of the distance between the centroids of the illuminated areas. The active illuminated area of the light source is the surface which actively lights up (e.g. the surface of a PN junction).

In a further display device according to an embodiment of the invention, each of the illuminated areas is formed by an optical scatter element or transparent cover element or optical colour-filter element which can be illuminated by the illumination device, and the non-illuminated areas of the display area are formed by areas of a filling material or substrate arranged between the illuminated areas.

A particularly efficient image representation is in turn possible due to this preferred design of the illuminated areas and assignment to the illumination device. In particular, the reflective properties of the non-illuminated areas can be set very well due to the design of the non-illuminated areas of substrate material or filling material. The scatter element is preferably a scatter element as described above in more detail.

In a further display device according to an embodiment of the invention, the display device has optical beam-shaping devices which are arranged between the illumination device and the display area, and preferably at least one, or precisely one, illuminated area is assigned to each beam-shaping device and each of the beam-shaping devices is set up to concentrate light from the illumination device onto the respective illuminated area.

Light can hereby be concentrated onto the illuminated areas by means of beam shaping, whereby the maximum achievable brightness is increased. The optical beam-shaping elements are preferably set up to concentrate and/or focus light from the illumination device onto an illuminated area. Preferably, one or more beam-shaping devices has a tip or a tubular or cylindrical end-piece (a so-called "light guide"), e.g. a fibre-glass piece, particularly preferably with a sealing diffusion layer, at the output.

A beam-shaping element is preferably assigned to an illuminated area if light propagates from the beam-shaping element coming through the illuminated area. The extent of the beam-shaping elements along the optical axis is preferably less than 3 mm, particularly preferably less than 1 mm, quite particularly preferably less than 0.5 mm or even more preferably less than 0.25 mm. The beam-shaping elements are preferably cast or produced by means of laser lithography. Preferably they form an array of beam-shaping elements. Preferably, at least one light source of the illumination device is assigned to each optical beam-shaping element.

It is possible to bridge the gap between the light sources and the illuminated areas very efficiently, due to the light concentration of the beam-shaping device (e.g. by means of a lens or a light guide, e.g. a glass fibre). Preferably, the beam-shaping device has an extent in the direction along the display area or the substrate which is greater than that of a light source, particularly preferably the extent is as great as the distance between the centroids of adjacent illuminated areas.

In a further display device according to an embodiment of the invention, each of the optical beam-shaping devices has an optical collimator. The light from the light source can hereby be collected and guided in a direction. For example, a collimator film (microprism film, micropyramid film, microsphere film) and/or a (parabolic/elliptical) reflector, with the light source preferably at the focal point, and/or (micro) lenses (Fresnel or conventional), are provided as a collimator, or generally a collimating reflective or transmissive optical system. A collimator is preferably set up to reduce the angle of radiation of a light source of the illumination device via beam deflection towards the optical axis.

In a further display device according to an embodiment of the invention, each of the optical beam-shaping devices has an optical concentrator. By this part of the beam-shaping device, the light is effectively concentrated onto the illuminated area. For example, a (customarily non-imaging) compound parabolic concentrator (CPC) is provided as concentrator, and/or photonic crystals or generally a focussing or concentrating reflective or transmissive optical system such as e.g. also an (imaging or non-imaging) capacitor or Fresnel lens. Preferably, the concentrator is a non-imaging optical system, whereby a higher efficiency of concentration and a homogenization of intensity can be achieved. The input of the optical concentrator facing the illumination device preferably has a larger area (e.g. 80 µm in diameter or in diagonal) than the output of the optical concentrator facing an illuminated area (e.g. 8 µm in diameter or in diagonal). This applies preferably to each optical concentrator. Preferably, the input has a surface which is formed to be as large and uniform as the light-emitting surfaces of the light source(s) assigned to the concentrator. Light from a larger entry area is hereby concentrated onto a small illuminated area. Preferably, the concentrator has an input and an output. Preferably, the input has a larger area than the output. Preferably, the output faces the illuminated area and the display area and the input faces the illumination device. The concentrator preferably has an optical input angle which is at most 30°, preferably at most 10° smaller than the optical output angle of the collimator. Particularly preferably, the optical input angle of the concentrator is equal to or greater than the output angle of the collimator.

In a further display device according to an embodiment of the invention, the optical collimator is arranged in front of the concentrator, with respect to a propagation direction of the light from the illumination device, with the result that light can first be substantially collimated and then concentrated. A particularly effective beam shaping is hereby possible. Particularly preferably, optical collimator and optical concentrator are combined in one element. Light-scatter losses can hereby be minimized. In a further display device according to an embodiment of the invention, the optical beam-shaping devices have at least one curved or stepped reflector surface. The light can be guided onto the illuminated areas through curved or stepped reflector surfaces with an enormously increased degree of effectiveness, in particular by taking advantage of the phenomenon of total reflection. Preferably these are parabolically or elliptically curved surfaces (e.g. of a CPC) or a facet mirror.

An embodiment of the invention provides a method for the representation of an image on a display device, wherein a display device according to an embodiment of the invention is used.

FIG. 1 depicts an enlarged section of a display device according to an embodiment of the invention, in which the proportion of non-illuminated areas on the display area is more than 70%. FIG. 1 shows an enlarged section of a display device 1 according to an embodiment of the invention, in which the proportion of non-illuminated areas 9 in the entire display area 2 is more than 70%. Display device 1 has a display area 2 (boundary=dashed line with the longest dashes) which consists of non-illuminated areas 9 and illuminated areas 12. The centroids of adjacent illuminated areas 12 have distances 11 from each other which are smaller than the resolving power of a viewer. This example also shows that one or more illuminated areas 12 are assigned to a pixel 10 (pixel boundary=dashed line with middle-length dashes) and the display area 2 has a plurality of such pixels 10 which are arranged in a repeating pattern, with the result that images can be composed from pixels 10.

A great advantage is that the illuminated areas 12 are separated from each other by large separating sections which are formed by non-illuminated areas 9, and thus on the one hand, no scattered light from one illuminated area 12 to the other occurs (or this is greatly reduced) and that, on the other hand, dark regions of an image represented by the display device 1 can appear even darker as the non-illuminated areas 9 predominate.

Figure 2:
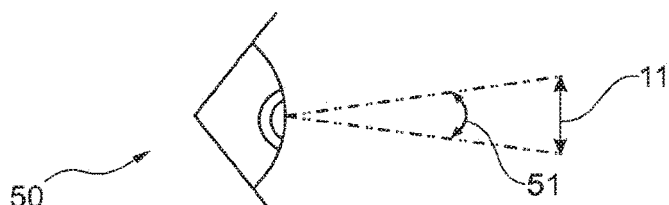
FIG. 2 depicts a purely qualitative illustration of a distance which is smaller than the resolving power of the viewer and which appears for the viewer at an angle of at most two angular minutes.

FIG. 2 depicts a purely qualitative illustration of a distance which is smaller than the resolving power of the viewer and which appears for the viewer at an angle of at most two angular minutes. FIG. 2 shows a purely qualitative illustration of a distance 11 which is smaller than the resolving power of the viewer 50 and which appears for the viewer at an angle 51 of at most two angular minutes. With such a distance 11, most viewers 50 can no longer perceive two different pixels 10 and they thus receive a particularly high quality and continuous image impression.

For reasons of space, the subsequent Figures also show various embodiment possibilities within a display device 1, which is not to be considered limiting. These mean that the corresponding display device preferably has only one form of the shown embodiment possibilities (applied to all illuminated areas/pixels) or a mixture of different embodiment possibilities (e.g. as then shown).

Figures 3A, 3B:
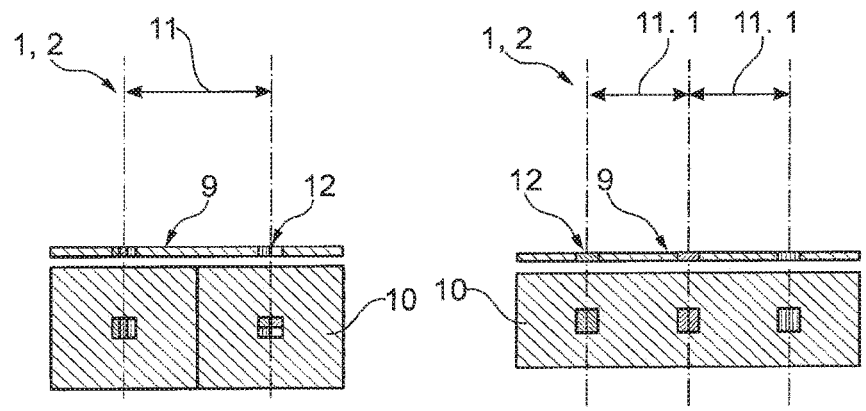
FIGS. 3a and 3b depict sections of display devices according to an embodiment of the invention, wherein the display device is a color display device.

FIGS. 3a and 3b depict sections of display devices according to embodiments of the invention building on FIG. 1, wherein the display device is a color display device. FIGS. 3a and 3b show sections of display devices 2 according to embodiments of the invention building on FIG. 1, wherein the display device 1 is a colour-display device. In each case, a side view is shown above a top view of the display area 2. However, hatchings are used here to distinguish between colours and to provide a better illustration.

Two pixels 10 are shown in FIG. 3a. In each case an illuminated area 12 is assigned to a pixel 10, wherein a plurality of colours are emitted towards the viewer via the illuminated area 12. Two possibilities for the composition of a pixel 10 are shown, on the left-hand side a composition of a pixel 10 from the colours red (narrow hatching from top left to bottom right), green (narrow hatching from bottom left to top right), blue (narrow vertical hatching) preferably in strip arrangement and to the right from the colours red, green, blue and white (without hatching) preferably in approximately square arrangement. Components with a broad hatching from top left to bottom left, as here the non-illuminated areas 9, are preferably light resistant.

In FIG. 3b there is shown a pixel 10 to which three illuminated areas 12 are assigned, wherein red can be emitted to the viewer via a first illuminated area 12, green can be emitted to the viewer via a second illuminated area 12 and blue can be emitted to the viewer via a third illuminated area 12. The distances 11.1 between the centroids of adjacent illuminated areas 12 are ⅓ of the distance 11 which is smaller than the resolving power of the viewer 50.

FIGS. 4a to 6d, how the two-dimensional structure of a display area according to the principle according to an embodiment of the invention, to provide a proportion of non-illuminated areas in the entire display area of more than 70%, can be obtained in different ways, wherein FIGS. 4a to 4e show sections of display devices according to an embodiment of the invention building on FIG. 3a or 3b, wherein the display device has an illumination device with a substrate, on which a plurality of light sources are arranged, wherein the light sources are preferably small light sources (e.g. VCSEL lasers), i.e. preferably light sources in which the surface area of the active illuminated area is smaller than or equal to the surface area of the corresponding illuminated area, and wherein FIGS. 5a to 6d show sections of display devices according to an embodiment of the invention building on FIG. 3a or 3b, wherein these have light sources which are larger in comparison with FIGS. 4a-4e and in particular in each case optical beam-shaping devices which are arranged between the illumination device and the display area, and wherein one illuminated area is assigned to each beam-shaping device and each of the beam-shaping devices is set up to concentrate light from the illumination device onto the respective illuminated area.

FIGS. 4a to 6d show how the two-dimensional structure of a display area 2 according to the principle according to embodiments of the invention, to provide a proportion of non-illuminated areas 9 in the entire display area 2 of more than 70%, can be obtained in different ways. Optical axes are in each case drawn in with dash-dotted lines and partially a preferred light pattern or colour of the corresponding light source 21 is indicated at the bottom end of the axis, and a preferably resulting light pattern or colour on the illuminated area 12 at the top end of the axis.

Figure 4A:
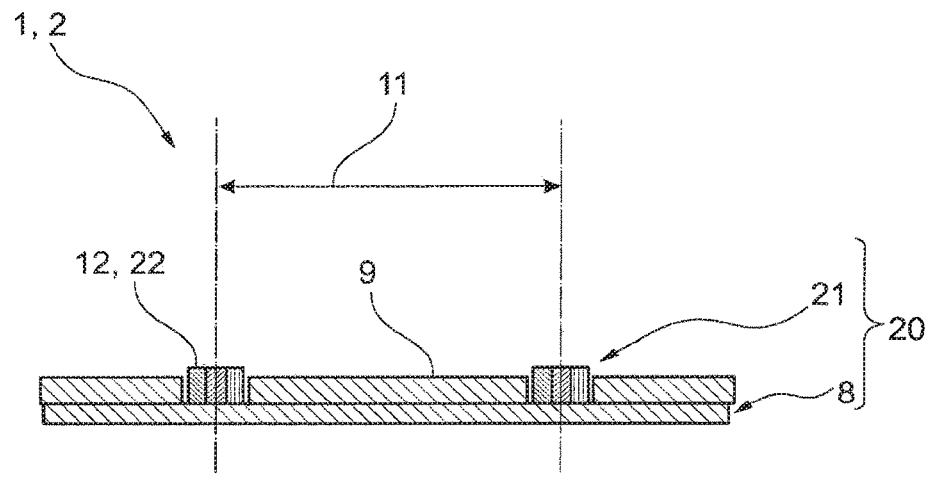
FIGS. 4a through 4e depict sections of a display device according to embodiments of the invention, wherein the display device has an illumination device with a substrate, on which a plurality of light sources are arranged.
Figure 4B:
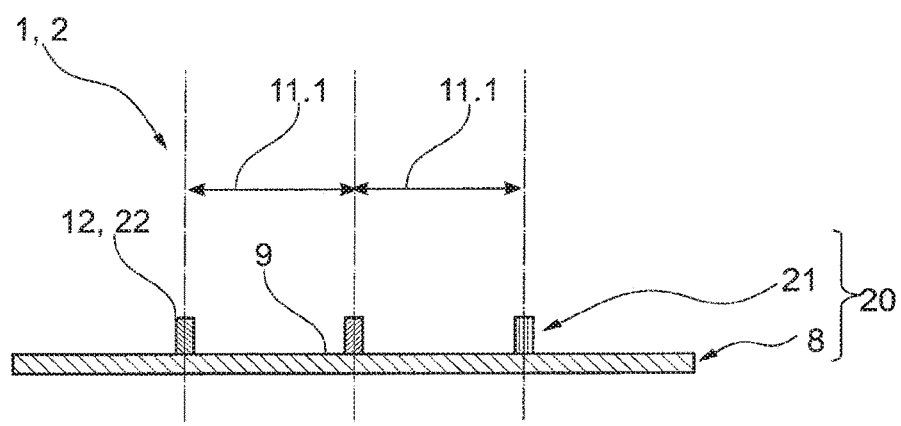
Figure 4D:
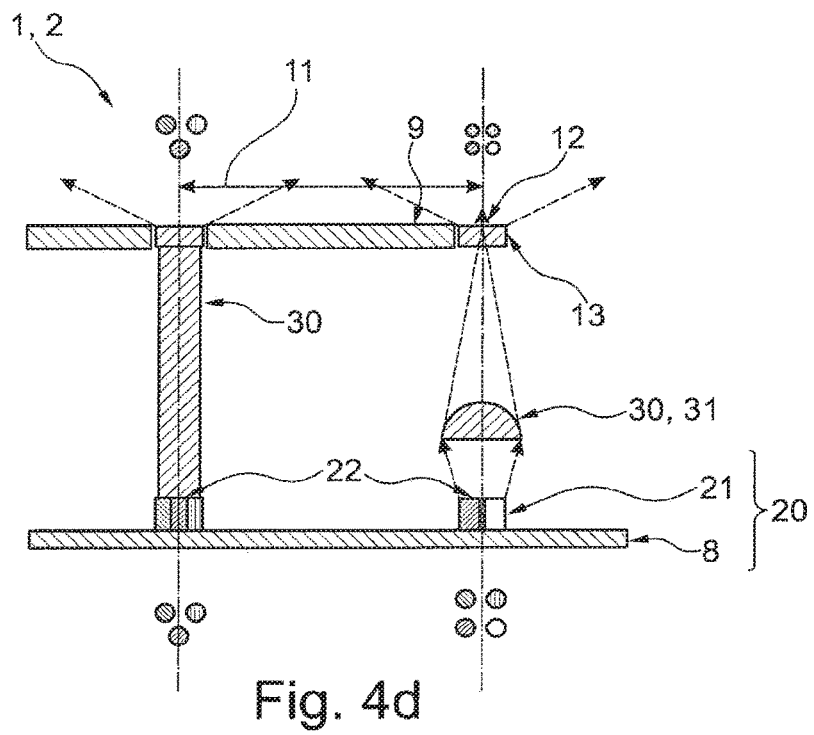
Figure 4C:
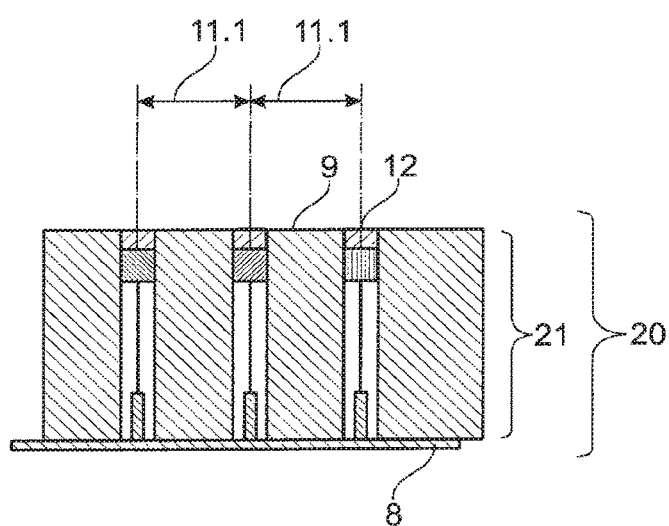
Figure 4E:
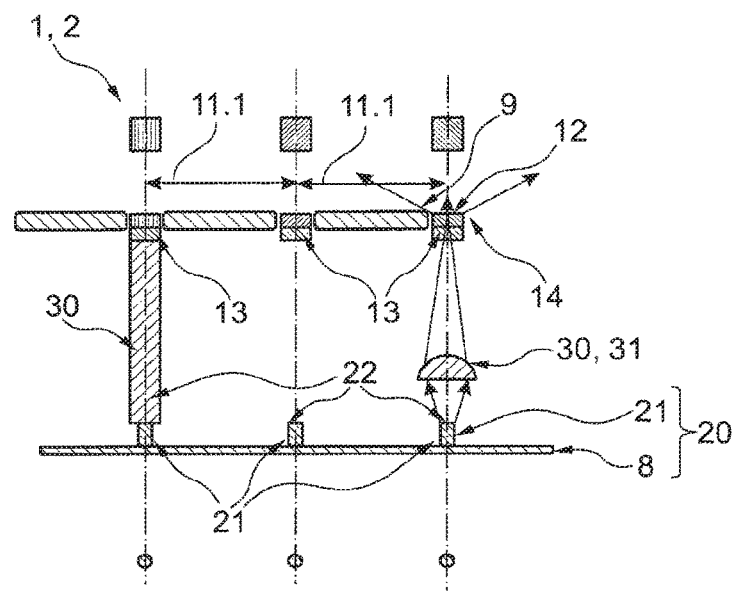

FIGS. 4a to 4e show section cuts of display devices 1 according to an embodiment of the invention building on FIG. 3a or 3b. The display device 1 has an illumination device 20 with a substrate 8 on which a plurality of light sources 21 are arranged, wherein preferably the light sources 21 are small light sources 21 (e.g. VCSEL lasers), i.e. preferably light sources 21 in which the surface area of the active illuminated area 22 is smaller than or equal to the surface area of the corresponding illuminated area 12. FIGS. 4a and 4d show light sources 21 which are polychromatic, i.e. which are set up to emit different, variable proportions of light with different wavelengths, e.g. red, green, blue proportions. FIGS. 4b, 4c and 4e show light sources 21 which are monochromatic, i.e. which emit a non-variable wavelength range or fixed mix of different wavelengths.

In FIG. 4a, the illuminated areas 12 are each formed by one of the light sources 21. The non-illuminated areas 9 of the display area 2 are formed by areas of a filling material between the light sources 21, which could just as well also be provided like this in FIG. 4b. In FIG. 4b, the illuminated areas 12 are each formed by one of the light sources 21. The non-illuminated areas 9 of the display area 2 are formed by areas of substrate 8, which could just as well also be provided like this in FIG. 4a. In FIGS. 4a and 4b the active illuminated area 22 of the respective light source 21 is thus similarly an illuminated area 12 of the display area 2. With fewer components, a display device can thus be produced, wherein, however, advantageously qualitatively very high-quality, bright and precisely dimensioned light sources are intended to be used for this.

In FIG. 4c, the illuminated areas 12 are each formed by a transparent cover element which can be illuminated by one of the light sources 21. The non-illuminated areas 9 of the display area 2 are formed by areas of a filling material between the light sources 21. Each light source 21 has a layer of luminescent material and an electron emitter which is set up to cause the layer of luminescent material to actively light up by emitting an electron beam. The layer of luminescent material can also be considered a scatter element, as it distributes the radiation energy arriving from one direction into a plurality of directions. Between the electron emitter and the layer of luminescent material there is in each case a vacuum in a vacuum cell.

An advantage of this is that, because of the inventive principle of a large intermediate area between the illuminated areas, a very good and favourable sealing of the vacuum cells is also possible.

In FIG. 4d the illuminated areas 12 are each formed by an optical scatter element 13 (broad hatching from bottom left to top right—this type of hatching preferably means that the thus hatched component, e.g. also later lenses, is transparent, preferably substantially without colour filtering) which can be illuminated by one of the light sources 21. The non-illuminated areas 9 of the display area 2 are formed by surfaces of a filling material between the light sources 21, at the height of the scatter elements 12. Two embodiment possibilities are shown, on the left with a so-called light guide (e.g. a glass fibre) as beam-shaping device 30, which also serves as concentrator 31; on the right with a lens as concentrator 31. The resulting light pattern on the illuminated area 12 is shown as above, on the left approximately at the same size as the light pattern of the illuminated area 22, on the right somewhat smaller. Additionally, the resulting light pattern is more diffuse, preferably with colours thoroughly mixed together, which takes place because of the scatter element 13, but which cannot be advantageously represented by a technical drawing. Because of this, a scattered radiation is achieved, but simultaneously a bundling of light onto the scatter elements 13.

In FIG. 4e the illuminated areas 12 are each formed by an optical colour-filter element 14 which can be illuminated by one of the light sources 21. The non-illuminated areas 9 of the display area 2 are formed by surfaces of a filling material between the light sources 21, at the height of the colour-filter elements 14. Each light source 21 has a UV emitter which is set up, by emitting a UV light beam, to cause a layer of luminescent material, which here e.g. also acts as scatter element 13, to actively light up. The different colours, here RGB, are thus received through the colour-filter elements 14, e.g. by quantum dots. Furthermore, three embodiment possibilities are shown, on the left and on the right beam-shaping elements 30, as in FIG. 4d, and in the centre, a variant without beam-shaping element 30.

Figure 6A:
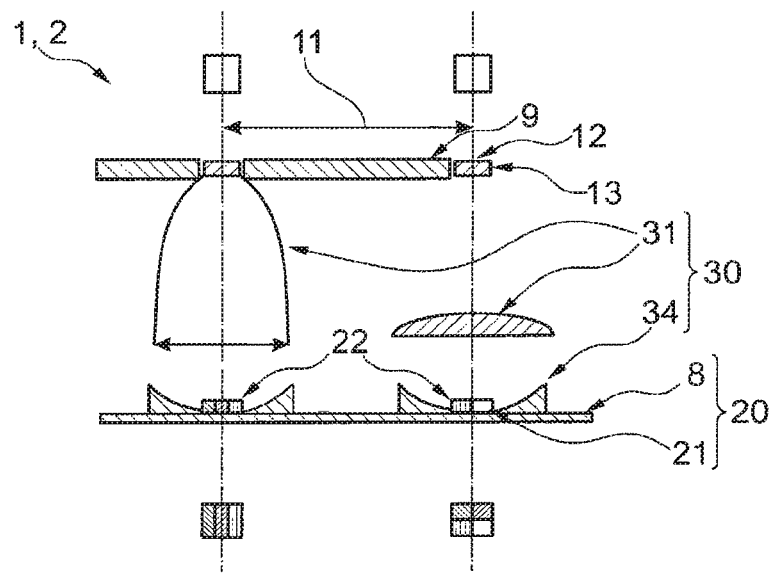
FIGS. 6a through 6d depict sections of a display device according to embodiments of the invention, wherein the display device has light sources and optical beam-shaping devices which are arranged between the illumination device and the display area.

Preferably, in FIGS. 4d and 4e, a collimator 34 is part of the beam-shaping device 30, analogously e.g. to FIG. 6a.

FIGS. 5a to 6d show sections of display devices 1 according to embodiments of the invention, building on FIG. 3a or 3b. Compared with FIGS. 4a-4e, these have larger light sources 21, and in particular in each case optical beam-shaping devices 30 which are arranged between the illumination device 20 and the display area 2, and an illuminated area 12 is assigned to each beam-shaping device 30, and the beam-shaping devices 30 are in each case set up to concentrate light from the illumination device 20 onto the respective illuminated area 12. The active illuminated areas 22 of the light sources 21 each have a surface area which is greater than the respective surface area of the illuminated area 12 of the display area 2. The display devices 1 each have optical beam-shaping devices 30 which are arranged between the illumination device 20 and the display area 2, and an illuminated area 12 is assigned to each beam-shaping device 30, and the beam-shaping devices 30 are in each case set up to concentrate light from the illumination device 20 onto the respective illuminated area 12. Each of the optical beam-shaping devices 30 has an optical collimator 34 (e.g. a hemispherical collimator lens) and an optical concentrator 31 with curved reflector surfaces, and each optical collimator 34 is arranged in front of the concentrator 31 with respect to a propagation direction of the light from the illumination device 20, with the result that light can first be substantially collimated and then concentrated. As concentrator 31, on the one hand a compound parabolic concentrator (CPC) is provided (represented by two opposing curved, preferably parabolically curved reflector surfaces and also shown in perspective in FIG. 5c); alternatively, a condenser lens 31 (e.g. on the right of FIG. 6a). As collimators 34, on the one hand, prism collimators 34 (indicated by a pyramid structure), or alternatively reflectors 34 (as in FIG. 6a to FIG. 6d) are present.

Figure 5A:
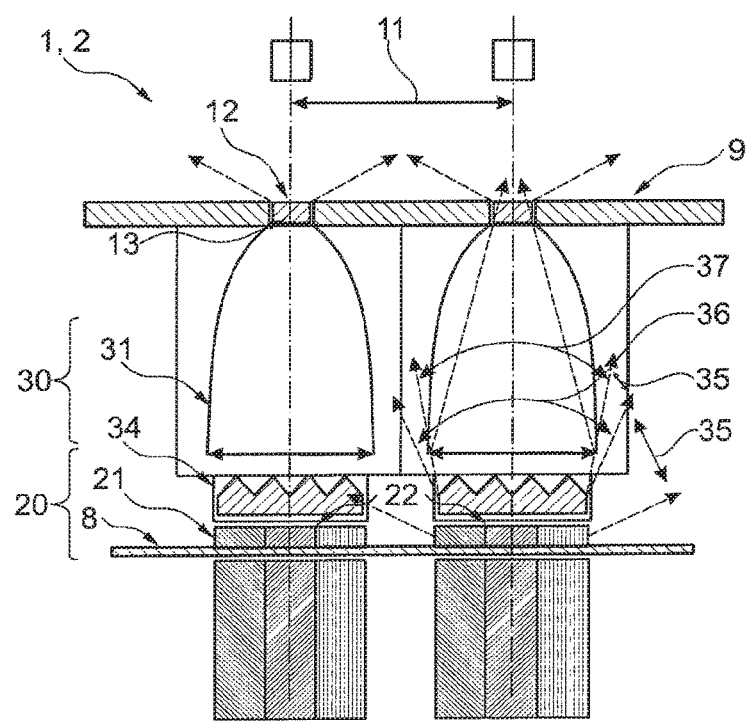

In FIGS. 5a, 5b and 5d the display devices 1 have light sources 21 which are approximately Lambertian radiators. In FIG. 5a, each illuminated area 12 is formed by an optical scatter element 13 which can be illuminated by the illumination device 20. The non-illuminated areas 9 of the display area 2 are formed by surfaces of a filling material arranged between the scatter elements 13, wherein the filling material is shown here as an area, but can just as well also completely fill the intermediate space between adjacent beam-shaping elements 30. The light sources are polychromatic and the light sources or the active illuminated areas thereof have an extent which is more than 50% of the distance 11 between the centroids of the illuminated areas 12. The CPCs 31 have an input 32 and an output 33 (see also FIG. 5c), wherein the input 32 has a larger surface area than the output 33 and the output 33 faces the illuminated area 12 and the display area 2, and the input 32 faces the illumination device 20. The CPC has an optical input angle 37 which is at most 30°-10°, preferably 20°, smaller than the optical output angle 36 of the prism collimator 34. Thus optical losses 35 can be minimized so far as possible. An effective light concentration onto the illuminated areas 12 takes place due to the combination of collimator 34 and concentrator 31. Additionally, a very homogeneous colour mixture is achieved by the CPC as a non-imaging optical system, which is indicated by the white output light pattern. The scatter element 13 allows a large viewing angle. The beam path of the light is indicated by dashed arrows. In FIG. 5b, a variant of the display device from FIG. 5a is shown, in which the extent of the light source 21 is smaller than 50% of the distance 11, but greater than the extent of the illuminated area 12. In FIG. 5d, unlike FIG. 5a, the light sources are monochromatic and the illuminated areas 12 are each formed by an optical colour-filter element, which is simultaneously a scatter element 13, which can be illuminated by the illumination device 20. Furthermore, distances 11.1 result between the illuminated areas 12 which are one third of the distance 11.

Figure 6B:
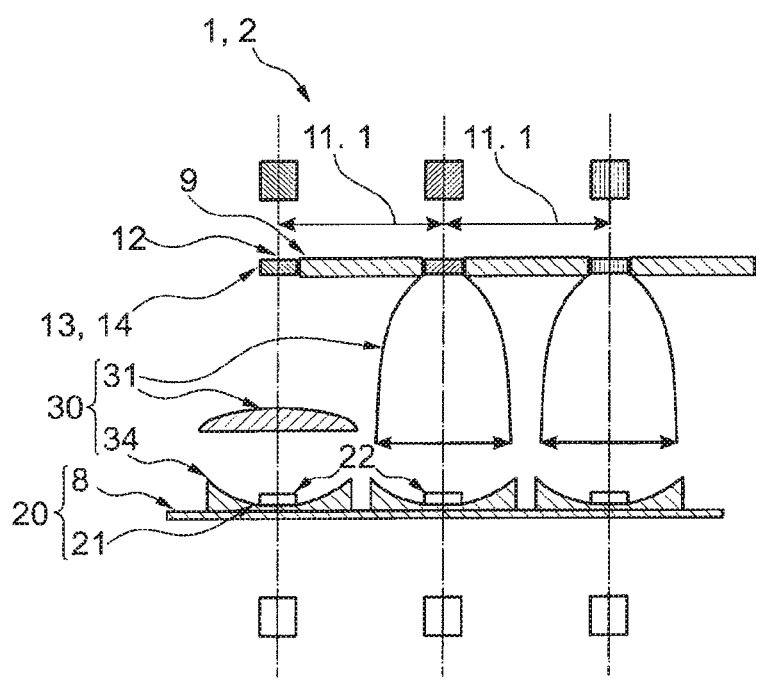
Figure 6C:
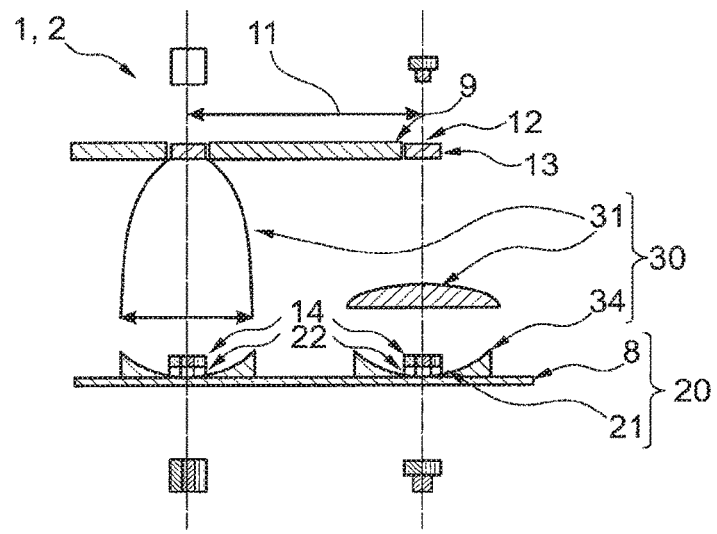
Figure 6D:
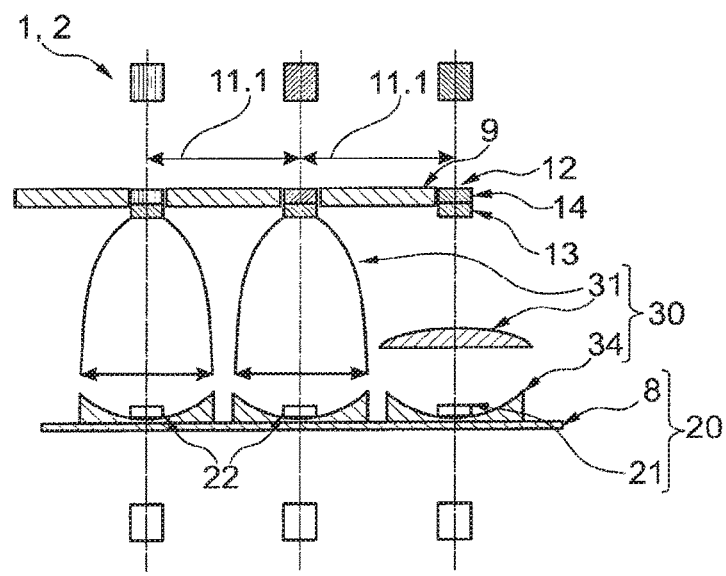

In FIGS. 6a, 6b, 6c and 6d, the display devices 1 have light sources 21 which, in terms of area (e.g. relative to the active illuminated area of a light source) are the same size as or larger than the illuminated areas 12. Otherwise, FIG. 6a is similar to FIG. 5a, wherein, unlike FIG. 5a, FIG. 6a shows collimators 34 which surround the light sources 21 as parabolic reflector. The optical collimator 34 is still arranged in front of the concentrator 31 with respect to a propagation direction of the light from the illumination device 20, with the result that light can first be substantially collimated and then concentrated. As a variant, an RGBW light source is shown on the right, as well as a condenser lens instead of a CPC as a concentrator 31, here a non-imaging condenser lens, which likewise brings about a good homogenization of the light transmitted through the illuminated area 12. FIG. 6b is similar to FIG. 6a, wherein the light sources 21 are monochromatic and each of the illuminated areas 12 is formed by an optical colour-filter element, which is simultaneously a scatter element 13, which can be illuminated by the illumination device 20. Furthermore, distances 11.1 result between the illuminated areas 12 which are one third of the distance 11. FIG. 6c is similar to FIG. 6a, wherein the light sources 21 are monochromatic, here white, and colour-filter elements 14 are arranged directly on the light sources 21. Furthermore, on the right, an embodiment possibility with an imaging condenser lens 31 is shown. FIG. 6d is similar to FIG. 6a, wherein the light sources 21 are monochromatic, here e.g. substantially blue- and/or UV-emitting. Each of the illuminated areas 12 is formed by an optical colour-filter element 14 which can be illuminated by the illumination device 20. Each light source 21 has a blue and/or UV emitter which is set up, by emitting a blue and/or UV light beam, to cause a layer of luminescent material, which here acts as a scatter element 13, to actively light up. The different colours, here RGB, are thus received through the colour-filter elements 14. Furthermore, distances 11.1 result between the illuminated areas 12 which are one third of the distance 11. Colour-filter elements 14 (e.g. quantum dots) are arranged directly on the light sources 21.

In all the embodiments shown, preferably non-illuminated areas 9, preferably the entire display area 2, have a reflectance of diffuse reflection and/or of specular reflection of less than 50%. For this purpose, the non-illuminated areas 9 preferably have a dark colour or are black and/or they have a mean roughness index in the range from 0.2 µm to 1.0 µm and/or are coated by means of a anti-reflection coating. Preferably, an electronic compensation device is additionally present, by means of which a minimum brightness of the illuminated areas 12 can be set automatically for adapting the representation of black image pixels in dependence on the ambient brightness.

With this invention, a revolutionary improvement in the quality of display devices is achieved. The image quality is increased by the principle of designing the non-illuminated areas lying between the illuminated areas to be as large as possible, e.g. by the proportion of non-illuminated areas in the entire display area being at least 70%, since the contrast is hereby improved and a lot of energy can be saved, which is very important in particular for portable devices. Black image components will also remain black due to an additional provision of the non-illuminated areas with a low reflectance (specular or diffuse). In order to be able to make the bright image regions even brighter, and also to compensate for the loss in brightness by the reduction of the surface proportion of the illuminated areas, special intensive light sources (e.g. lasers or micro LEDs or micro OLEDS) are used, or a concentration of light onto the illuminated areas and thus a brightness boost is achieved by means of special beam-shaping devices which lie behind the display device, seen from the point of view of the viewer, with the result that the brightness mean value is similar to that of normal display devices, but with better contrast and lower energy consumption, depending on the ambient light.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE NUMBERS

1 Display device
2 Display area of the display device
8 Substrate
9 Non-illuminated area
10 Pixel
11 Distance
11.1 ⅓ of distance 11
12 Illuminated area
13 Scatter element
14 Colour-filter element
20 Illumination device
21 Light source
22 Active illuminated area of the light source
30 Optical beam-shaping device
31 Optical concentrator
32 Input of the optical concentrator
33 Output of the optical concentrator
34 Optical collimator
35 Optical losses
36 Output angle of the optical collimator
37 Input angle of the optical concentrator
50 Viewer
51 Angle of incidence

The invention claimed is:

1. A display device comprising:
a display surface comprising non-light-emitting areas and light-emitting areas, the display surface forming an outer surface of the display device, the total surface area of the light-emitting areas at the display surface forming less than 30% of the surface area of the entire display,
wherein: centroids of adjacent light-emitting areas are separated by distances which are smaller than 190um,
wherein the diameter of each light emitting area at said display surface is less than 25um, and
wherein each light emitting area forms a pixel of an image.

2. The display device according to claim 1 wherein the centroids of adjacent illuminated areas are separated by at most 80 μm.

3. The display device according to claim 1 wherein the diameter of each light emitting area at said display surface is less than 10 um.

4. The display device according to claim 1, wherein a majority of the non-illuminated areas has a reflectance of diffuse reflection of less than 50%.

5. The display device according claim 1, wherein a majority of the non-illuminated areas has a reflectance of specular reflection of less than 50%.

6. The display device according to claim 1, wherein a majority of the non-illuminated areas has a dark color or is black.

7. The display device according to claim 1, wherein a majority of the non-illuminated areas has a mean roughness index in the range from 0.2 μm to 1.0 μm.

8. The display device according to claim 1, further comprising an electronic compensation device, by way of which a minimum brightness of the illuminated areas for adapting the representation of black image pixels can be set automatically, depending on the ambient brightness.

9. The display device according to claim 1 further comprising an illumination device with a substrate on which a plurality of light sources are arranged, each of the illuminated areas illuminated by one of the light sources.

10. The display device according to claim 9, wherein the non-illuminated areas of the display area are formed by areas of a filling material between the illuminated areas.

11. The display device according to claim 10, wherein each light source has an electron emitter which is set up to cause a layer of luminescent material to actively light up by emitting an electron beam, or each light source has a UV emitter which is set up to cause the layer of luminescent material to actively light up by emitting a UV light beam.

12. The display device according to claim 8, wherein each light source comprises an illuminated surface area which is greater than the surface area of each illuminated area of the display surface.

13. The display device according to claim 1, further comprising optical beam-shaping devices which are arranged between the illumination device and the display surface,
wherein an illuminated area is assigned to each beam-shaping device, and
wherein each of the beam-shaping devices is set up to concentrate light from the illumination device onto the respective illuminated area.

14. The display device according to claim 13, wherein each of the optical beam-shaping devices comprises an optical collimator.

15. The display device according to claim 13, wherein each of the optical beam-shaping devices comprises an optical concentrator.

16. The display device according to claim 13, wherein each optical beam-shaping device comprises at least one curved or stepped reflector surface.

17. A display device comprising:
an illumination device; and
a display surface comprising non-light-emitting areas and light-emitting areas, the total surface area of the light-emitting areas at the display surface forming less than 30% of the surface area of the entire display,
wherein: centroids of adjacent light-emitting areas are separated by distances which are smaller than 190um,
wherein the diameter of each light emitting area at said display surface is less than 25um,
wherein each light emitting area forms a different pixel of an image, and
wherein the display device further comprises optical beam-shaping devices arranged between said illumination device and said light emitting areas at said display surface, each said optical beam-shaping device assigned to a different said light emitting area and configured to guide light from said illumination device to said assigned light emitting area.

18. The display device according to claim 17 wherein the centroids of adjacent illuminated areas are separated by at most 80 μm.

19. The display device according to claim 17 wherein the diameter of each light emitting area at said display surface is less than 10 um.

20. The display device according to claim 17, wherein a majority of the non-illuminated areas has a reflectance of diffuse reflection of less than 50%.

21. The display device according claim 17, wherein a majority of the non-illuminated areas has a reflectance of specular reflection of less than 50%.

22. The display device according to claim 17 wherein a majority of the non-illuminated areas is coated by means of an anti-reflection coating.

23. The display device according to claim 17, wherein a majority of the non-illuminated areas has a dark color or is black.

24. The display device according to claim 17, wherein a majority of the non-illuminated areas has a mean roughness index in the range from 0.2 μm to 1.0 μm.

25. The display device according to claim 17, wherein the display device comprises an electronic compensation device, by way of which a minimum brightness of the illuminated areas for adapting the representation of black image pixels can be set automatically, depending on the ambient brightness.

26. The display device according to claim 17 comprising an illumination device with a substrate on which a plurality of light sources are arranged, each of the illuminated areas illuminated by one of the light sources.

27. The display device according to claim 26, wherein the non-illuminated areas of the display area are formed by areas of a filling material between the illuminated areas.

28. The display device according to claim 26, wherein said each light source comprises an electron emitter which is set up to cause a layer of luminescent material to actively light up by emitting an electron beam, or each light source has a UV emitter which is set up to cause the layer of luminescent material to actively light up by emitting a UV light beam.

29. The display device according to claim 26, wherein each said light source comprises an illuminated surface area which is greater than the surface area of each illuminated area of the display surface.

30. The display device according to claim 17, wherein each said optical beam-shaping device comprises an optical collimator.

31. The display device according to claim 17, wherein each said optical beam-shaping device comprises an optical concentrator.

32. The display device according to claim 17, wherein each said optical beam-shaping device comprises at least one curved or stepped reflector surface.

* * * * *